(12) United States Patent
Jan

(10) Patent No.: US 11,199,564 B2
(45) Date of Patent: Dec. 14, 2021

(54) CURRENT SENSING CIRCUIT

(71) Applicant: uPI Semiconductor Corp., Hsinchu County (TW)

(72) Inventor: Yi-Xian Jan, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 17/067,768

(22) Filed: Oct. 12, 2020

(65) Prior Publication Data

US 2021/0148956 A1    May 20, 2021

(30) Foreign Application Priority Data

Nov. 15, 2019 (TW) ................................. 108215170

(51) Int. Cl.
*G01R 19/10* (2006.01)

(52) U.S. Cl.
CPC .................... *G01R 19/10* (2013.01)

(58) Field of Classification Search
None
See application file for complete search history.

(56) References Cited

U.S. PATENT DOCUMENTS

| | | | |
|---|---|---|---|
| 4,728,900 A | 3/1988 | Nakagawara et al. | |
| 5,774,021 A | 6/1998 | Szepesi et al. | |
| 6,621,259 B2 | 9/2003 | Jones et al. | |
| 7,015,728 B1 | 3/2006 | Solic | |
| 7,202,738 B1 | 4/2007 | Huijsing et al. | |
| 8,648,623 B2 | 2/2014 | Liu et al. | |
| 2012/0249133 A1* | 10/2012 | Friedrich | G01R 33/072 324/247 |

* cited by examiner

*Primary Examiner* — Jas A Sanghera
(74) *Attorney, Agent, or Firm* — JCIPRNET

(57) ABSTRACT

A current sensing circuit is provided. The current sensing circuit includes an amplifier, an input resistor, a sensing resistor, and a feedback circuit. The amplifier has a first input terminal, a second input terminal, a third input terminal, and an output terminal. The input resistor is coupled between the first input terminal and the second input terminal of the amplifier. The sensing resistor is coupled between the second input terminal and the third input terminal of the amplifier. The feedback circuit is coupled between the first input terminal and the output terminal. When an input current flows through the sensing resistor, a voltage across the sensing resistor is equal to a voltage across the input resistor, and the feedback circuit correspondingly outputs a sensing voltage according to the input current.

8 Claims, 4 Drawing Sheets

US 11,199,564 B2

CURRENT SENSING CIRCUIT

CROSS-REFERENCE TO RELATED APPLICATION

This application claims the priority benefit of Taiwan application serial no. 108215170, filed on Nov. 15, 2019. The entirety of the above-mentioned patent application is hereby incorporated by reference herein and made a part of this specification.

BACKGROUND

Technical Field

The invention relates to a sensing circuit, and particularly relates to a current sensing circuit.

Description of Related Art

In a conventional current sensing circuit, since an input terminal of an amplifier of the current sensing circuit needs to be coupled to an input resistor, an input capacitance and an input resistance of the input terminal of the amplifier produce an RC effect. Therefore, the conventional current sensing circuit requires an additional resistance to balance the RC effect, so that an additional resistor element and a design of additional resistance matching are required. The prior art adopts a framework of multiple amplifiers to overcome the aforementioned RC effect, but it will increase circuit complexity, and the multiple amplifiers are probably operated in different power domains, which makes circuit matching difficult. Therefore, solutions of several embodiments are proposed below.

SUMMARY

The invention is directed to a current sensing circuit, which is capable of providing an effective current sensing function.

The invention provides a current sensing circuit including an amplifier, an input resistor, a sensing resistor, and a feedback circuit. The amplifier has a first input terminal, a second input terminal, a third input terminal, and an output terminal. The input resistor is coupled between the first input terminal and the second input terminal. The sensing resistor is coupled between the second input terminal and the third input terminal. The feedback circuit is coupled between the first input terminal and the output terminal. When an input current flows through the sensing resistor, a voltage across the sensing resistor is equal to a voltage across the input resistor, and the feedback circuit correspondingly outputs a sensing voltage according to the input current.

In an embodiment of the invention, the second input terminal is coupled to an input voltage.

In an embodiment of the invention, the feedback circuit includes a feedback transistor and a feedback resistor. A first terminal of the feedback transistor is coupled to the first input terminal of the amplifier. A control terminal of the feedback transistor is coupled to the output terminal of the amplifier. A second terminal of the feedback transistor outputs the sensing voltage. The feedback resistor is coupled between the second terminal of the feedback transistor and ground.

In an embodiment of the invention, the sensing voltage satisfies a following equation:

$$\frac{V_{OUT1}}{I_{S1}} = R_{S1} \times \frac{R_2}{R_1}.$$

$V_{OUT1}$ is a voltage value of the sensing voltage. $I_{S1}$ is a current value of the input current. $R_{S1}$ is a resistance value of the sensing resistor. $R_1$ is a resistance value of the input resistor. $R_2$ is a resistance value of the feedback resistor.

In an embodiment of the invention, the second input terminal is coupled to a ground voltage, and the third input terminal is coupled to an input voltage.

In an embodiment of the invention, the feedback circuit includes a feedback transistor and a feedback resistor. A first terminal of the feedback transistor is coupled to a reference voltage. A control terminal of the feedback transistor is coupled to the output terminal of the amplifier. A second terminal of the feedback transistor outputs the sensing voltage. The feedback resistor is coupled between the second terminal of the feedback transistor and the first input terminal of the amplifier.

In an embodiment of the invention, the sensing voltage satisfies a following equation:

$$\frac{V_{OUT2}}{I_{S2}} = R_{S2} \times \frac{R_3 + R_4}{R_3}.$$

$V_{OUT2}$ is a voltage value of the sensing voltage. $I_{S2}$ is a current value of the input current. $R_{S2}$ is a resistance value of the sensing resistor. $R_3$ is a resistance value of the input resistor. $R_4$ is a resistance value of the feedback resistor.

In an embodiment of the invention, the amplifier includes a first voltage-current conversion element, a second voltage-current conversion element, a third voltage-current conversion element, a fourth voltage-current conversion element, and a subtraction circuit. The first voltage-current conversion element is coupled to the first input terminal of the amplifier, and is configured to output a first current to a first current node. The second voltage-current conversion element is coupled to the second input terminal of the amplifier, and is configured to output a second current to the first current node. The third voltage-current conversion element is coupled to the second input terminal of the amplifier, and is configured to output a third current to a second current node. The fourth voltage-current conversion element is coupled to the second input terminal of the amplifier, and is configured to output a fourth current to the second current node. The subtraction circuit is coupled to the first current node and the second current node. The subtraction circuit is configured to receive a first reference current output by the first current node and receive a second reference current output by the second current node. The subtraction circuit subtracts the first reference current and the second reference current to output a third reference current. A current-voltage conversion element is coupled to the subtraction circuit for providing an output voltage to the feedback circuit according to the third reference current.

According to the above description, the current sensing circuit of the invention is capable of reducing or even eliminating the influence of the RC effect of input resistance and input capacitance, and the circuit is simple and has good circuit matching to provide a good current sensing function.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
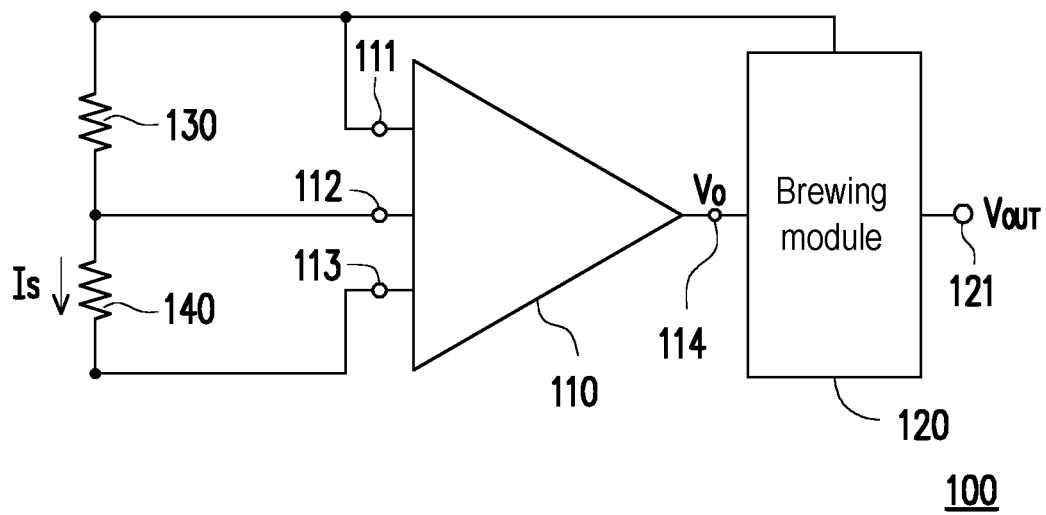
FIG. 1 is a schematic diagram of a current sensing circuit according to an embodiment of the invention.

In order to make the content of the invention easier to understand, the following embodiments are specifically provided as examples on which the invention may be implemented. Moreover, wherever possible, the same reference numbers are used in the drawings and the description to refer to the same or like parts/components/steps. In addition, "first", "second", etc. mentioned in the specification and the claims are merely used to name components or distinguish different embodiments or ranges and should not be regarded as limiting the upper or lower bound of the number of the components, nor is it used to define a manufacturing order or setting order of the components.

FIG. 1 is a schematic diagram of a current sensing circuit according to an embodiment of the invention. Referring to FIG. 1, a current sensing circuit 100 includes an amplifier 110, a feedback circuit 120, an input resistor 130, and a sensing resistor 140. In the embodiment, the amplifier 110 has a first input terminal 111, a second input terminal 112, a third input terminal 113, and an output terminal 114. The input resistor 130 is coupled between the first input terminal 111 and the second input terminal 112 of the amplifier 110. The sensing resistor 140 is coupled between the second input terminal 112 and the third input terminal 113 of the amplifier 110. The feedback circuit 120 is coupled between the first input terminal 111 and the output terminal 114 of the amplifier 110, and is coupled to a voltage output terminal 121. The output terminal 114 of the amplifier 110 provides an output voltage $V_O$ to the feedback circuit 120. When an input current $I_S$ flows through the sensing resistor 140, a voltage across the sensing resistor 140 is equal to a voltage across the input resistor 130, and the feedback circuit 120 correspondingly outputs a sensing voltage $V_{OUT}$ from the voltage output terminal 121 according to the input current $I_S$. It should be noted that since the voltage across the sensing resistor 140 generated by the input current $I_S$ is directly input to the second input terminal 112 and the third input terminal 113 of the amplifier 110, the input of the amplifier 110 of the embodiment will not have the problem of the RC effect.

Figure 2:
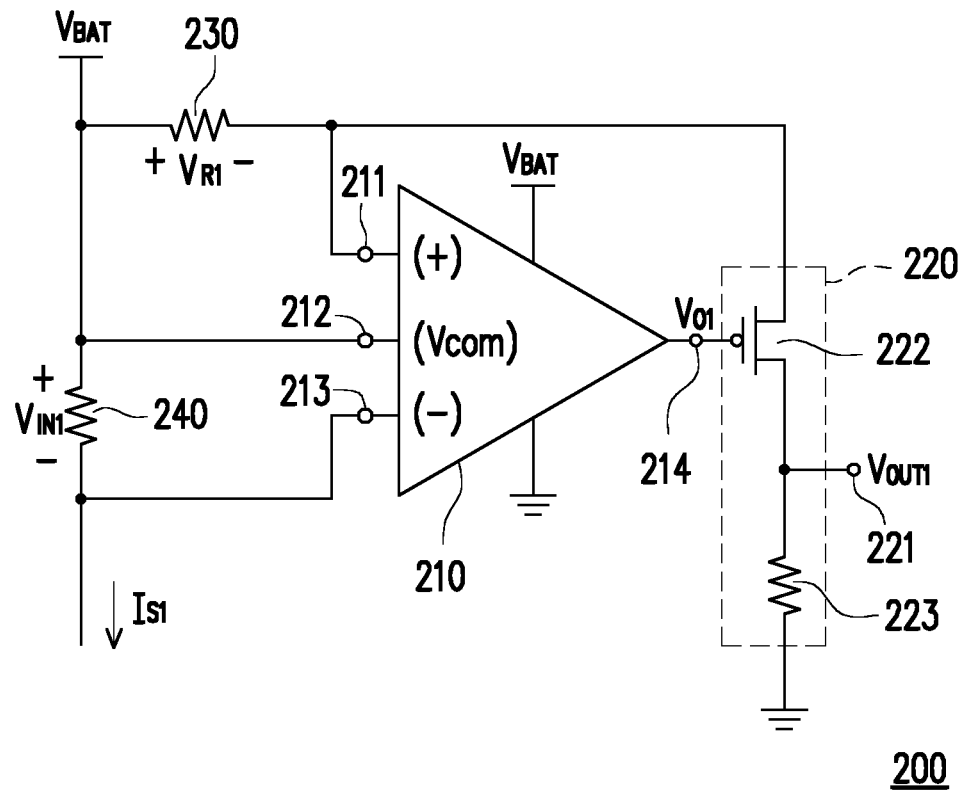
FIG. 2 is a circuit schematic diagram of a current sensing circuit according to a first embodiment of the invention.

FIG. 2 is a circuit schematic diagram of a current sensing circuit according to a first embodiment of the invention. Referring to FIG. 2, a current sensing circuit 200 of FIG. 2 has an input-balanced differential amplifier (IBDA) framework, which is suitable for high-side current sensing on the side of an input voltage $V_{BAT}$. The current sensing circuit 200 includes an amplifier 210, a feedback circuit 220, an input resistor 230, and a sensing resistor 240. In the embodiment, the amplifier 210 has a first input terminal 211, a second input terminal 212, a third input terminal 213, and an output terminal 214. The input resistor 230 is coupled between the first input terminal 211 and the second input terminal 212 of the amplifier 210. The sensing resistor 240 is coupled between the second input terminal 212 and the third input terminal 213 of the amplifier 210. The feedback circuit 220 is coupled between the first input terminal 211 and the output terminal 214, and is coupled to a voltage output terminal 221. The feedback circuit 220 includes a feedback transistor 222 and a feedback resistor 223. In the embodiment, the feedback transistor 222 is a P-type transistor. A first terminal of the feedback transistor 222 is coupled to the first input terminal 211 of the amplifier 210. A control terminal of the feedback transistor 222 is coupled to the output terminal 214 of the amplifier 210. A second terminal of the feedback transistor 222 is coupled to the voltage output terminal 221 and one end of the feedback resistor 223. The other end of the feedback resistor 223 is grounded.

In the embodiment, the first input terminal 211 of the amplifier 210 is a non-inverting input terminal (+). The second input terminal 212 of the amplifier 210 is a common mode input terminal (Vcom), which prevents a differential input terminal from having different common modes. The third input terminal 213 of the amplifier 210 is an inverting input terminal (−). In the embodiment, the second input terminal 212 of the amplifier 210 is coupled to the input voltage $V_{BAT}$. When an input current $I_{S1}$ flows through the sensing resistor 240, a voltage $V_{IN1}$ across the sensing resistor 240 is generated. Since the second input terminal 212 is used as a common mode input terminal for coupling to the input voltage $V_{BAT}$, and the first input terminal 211 and the third input terminal 213 of the amplifier 210 are of equal potential, the voltage $V_{IN1}$ across the sensing resistor 240 is equal to a voltage $V_{R1}$ across the input resistor 230. Moreover, the output terminal 214 of the amplifier 210 provides an output voltage $V_{O1}$ to the control terminal of the feedback transistor 222 to turn on the feedback transistor 222, so that a feedback current flows from the input voltage $V_{BAT}$ to the feedback transistor 222 and the feedback resistor 223. Therefore, the voltage output terminal 221 correspondingly outputs a sensing voltage $V_{OUT1}$ due to a voltage drop generated by the feedback current on the feedback resistor 223.

In the embodiment, the sensing voltage $V_{OUT1}$ output from the voltage output terminal 221 of the current sensing circuit 200 may be derived from following equations (1)-(3). In the following equations (1)-(3), $R_{S1}$ is a resistance value of the sensing resistor 240, $R_1$ is a resistance value of the input resistor 230, and $R_2$ is a resistance value of the feedback resistor 223.

$$V_{IN1} = I_{S1} \times R_{S1} \qquad \text{equation (1)}$$

$$\frac{V_{OUT1}}{V_{IN1}} = \frac{R_2}{R_1} \qquad \text{equation (2)}$$

$$\frac{V_{OUT1}}{I_{S1}} = R_{S1} \times \frac{R_2}{R_1} \qquad \text{equation (3)}$$

Therefore, the current sensing circuit 200 of the embodiment may effectively sense the input current $I_{S1}$ to correspondingly output the sensing voltage $V_{OUT1}$. In addition, since the voltage $V_{IN1}$ across the sensing resistor 240 generated by the input current $I_{S1}$ is directly input to the second input terminal 212 and the third input terminal 213 of the amplifier 210, the input of the amplifier 210 of the embodiment will not have the problem of the RC effect. Moreover, since the amplifier 210 is also operated in a same power domain of the input voltage $V_{BAT}$, in the current sensing circuit 200, it is unnecessary to consider the problem of circuit matching between different power domains.

Figure 3:
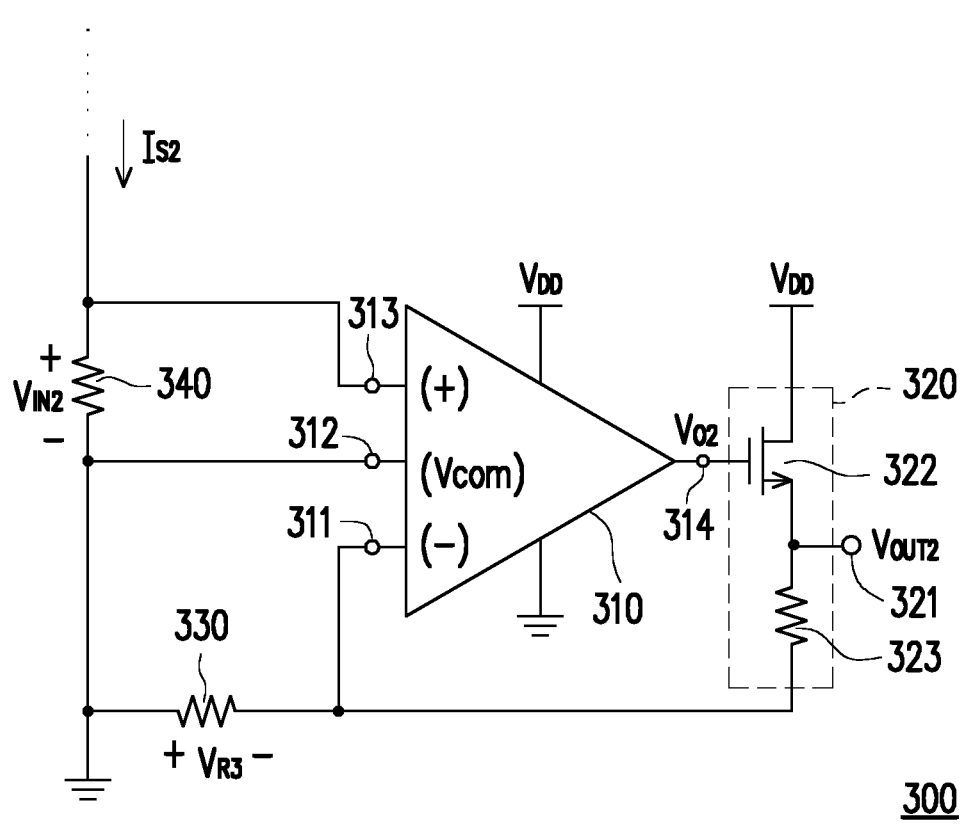
FIG. 3 is a circuit schematic diagram of a current sensing circuit according to a second embodiment of the invention.

FIG. 3 is a circuit schematic diagram of a current sensing circuit according to a second embodiment of the invention. Referring to FIG. 3, a current sensing circuit 300 of FIG. 3 has an input-balance differential amplifier (IBDA) framework, and is suitable for low-side current sensing of a ground side. The current sensing circuit 300 includes an amplifier 310, a feedback circuit 320, an input resistor 330, and a sensing resistor 340. In the embodiment, the amplifier 310 has a first input terminal 311, a second input terminal 312, a third input terminal 313, and an output terminal 314. The input resistor 330 is coupled between the first input terminal 311 and the second input terminal 312 of the amplifier 310. The sensing resistor 340 is coupled between the second input terminal 312 and the third input terminal 313 of the amplifier 310. The feedback circuit 320 is coupled between the first input terminal 311 and the output terminal 314, and is coupled to a voltage output terminal 321. The feedback circuit 320 includes a feedback transistor 322 and a feedback resistor 323. In the embodiment, the feedback transistor 322 is an N-type transistor. A first terminal of the feedback transistor 322 is coupled to an input voltage $V_{DD}$. A control terminal of the feedback transistor 322 is coupled to the output terminal 314 of the amplifier 310. A second terminal of the feedback transistor 322 is coupled to the voltage output terminal 321 and one end of the feedback resistor 323. The other end of the feedback resistor 323 is grounded.

In the embodiment, the first input terminal 311 of the amplifier 310 is an inverting input terminal (−). The second input terminal 312 of the amplifier 310 is a common mode input terminal (Vcom), which prevents a differential input terminal from having different common modes. The third input terminal 313 of the amplifier 310 is a non-inverting input terminal (+). In the embodiment, the second input terminal 312 of the amplifier 310 is coupled to a ground voltage. An input current $I_{S2}$ flows through the sensing resistor 340, and a voltage $V_{IN2}$ across the sensing resistor 340 is generated. Since the second input terminal 312 is coupled to the ground voltage, and the first input terminal 311 and the third input terminal 313 of the amplifier 310 are of equal potential, the voltage $V_{IN2}$ across the sensing resistor 340 is equal to a voltage $V_{R3}$ across the input resistor 330. Moreover, the output terminal 314 of the amplifier 310 outputs an output voltage $V_{O2}$ to the control terminal of the feedback transistor 322 to turn on the feedback transistor 322, so that a feedback current flows from the ground voltage to the feedback transistor 322 and the feedback resistor 323. Therefore, the voltage output terminal 321 correspondingly outputs a sensing voltage $V_{OUT2}$ due to a voltage drop generated by the feedback current on the feedback resistor 323.

In the embodiment, the sensing voltage $V_{OUT2}$ output from the voltage output terminal 321 of the current sensing circuit 300 may be derived from following equations (4)-(6). In the following equations (4)-(6), $R_{S2}$ is a resistance value of the sensing resistor 340, $R_3$ is a resistance value of the input resistor 330, and $R_4$ is a resistance value of the feedback resistor 323.

$$V_{IN2} = I_{S2} \times R_{S2} \quad \text{equation (4)}$$

$$\frac{V_{OUT2}}{V_{IN2}} = \frac{R_3 + R_4}{R_3} \quad \text{equation (5)}$$

$$\frac{V_{OUT2}}{I_{S2}} = R_{S2} \times \frac{R_3 + R_4}{R_3} \quad \text{equation (6)}$$

Therefore, the current sensing circuit 300 of the embodiment may effectively sense the input current $I_{S2}$ to correspondingly output the sensing voltage $V_{OUT2}$. In addition, since the voltage $V_{IN2}$ across the sensing resistor 340 generated by the input current $I_{S2}$ is directly input to the second input terminal 312 and the third input terminal 313 of the amplifier 310, the input of the amplifier 310 of the embodiment will not have the problem of the RC effect. Moreover, since the amplifier 310 is also operated in a same power domain of the feedback transistor 322, in the current sensing circuit 300, it is unnecessary to consider the problem of circuit matching between different power domains.

Figure 4:
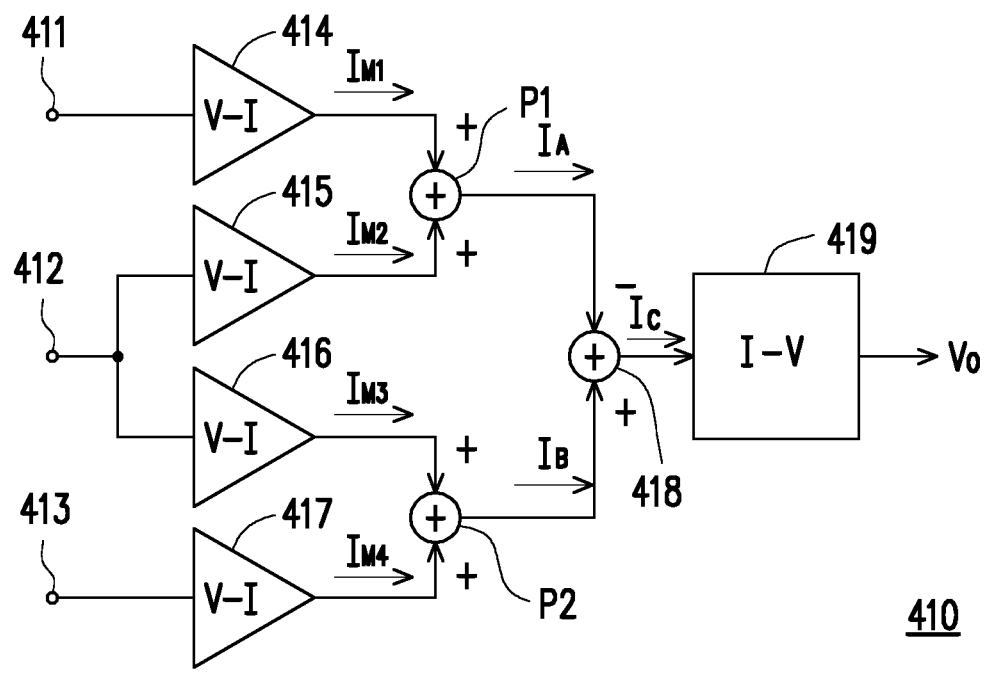
FIG. 4 is a schematic diagram of an amplifier according to an embodiment of the invention.

FIG. 4 is a schematic diagram of an amplifier according to an embodiment of the invention. Referring to FIG. 4, a system framework of the amplifier 410 of the embodiment may be applied to the amplifiers 110-310 of the embodiments of FIG. 1 to FIG. 3. In the embodiment, the amplifier 410 includes voltage-current conversion elements 414-417, a subtraction circuit 418, and a current-voltage conversion element 419. The voltage-current conversion element 414 is coupled to the first input terminal 411 of the amplifier 410, and is configured to perform voltage-current conversion to output a current $I_{M1}$ to a current node P1. The voltage-current conversion element 415 is coupled to the second input terminal 412 (the common mode input terminal) of the amplifier 410, and is configured to perform voltage-current conversion to output a current $I_{M2}$ to the current node P1. The voltage-current conversion element 416 is coupled to the second input terminal 412 of the amplifier 410 and is configured to perform voltage-current conversion to output a current $I_{M3}$ to a current node P2. The voltage-current conversion element 417 is coupled to the third input terminal 413 of the amplifier 410, and is configured to perform voltage-current conversion to output a current $I_{M4}$ to the current node P2.

In the embodiment, after the current $I_{M1}$ is added to the current $I_{M2}$ at the current node P1, the current node P1 outputs a reference current $I_A$. After the current $I_{M3}$ is added to the current $I_{M4}$ at the current node P2, the current node P2 outputs a reference current $I_B$. The subtraction circuit 418 is coupled to the current nodes P1 and P2, and is configured to receive the reference currents $I_A$ and $I_B$ output by the current nodes P1 and P2, and subtract the reference currents $I_A$ and $I_B$ to output a reference current $I_C$. The current-voltage conversion element 419 is coupled to the subtraction circuit 418, and generates an output voltage $V_O$ according to the reference current $I_C$. It should be noted that the voltage-current conversion elements 414-417 of the embodiment are composed of transistors (which will be described in detail below in FIG. 5 and FIG. 6). In this regard, since the first input terminal 411, the second input terminal 412, and the third input terminal 413 of the amplifier 410 of the embodiment do not need to be attached with additional resistors, transconductances (GM) of the voltage-current conversion elements 414-417 are not limited by resistors, and the transistors may be arranged in a same well region and fabricated under a same manufacturing process, which achieves a good matching effect.

Figure 5:
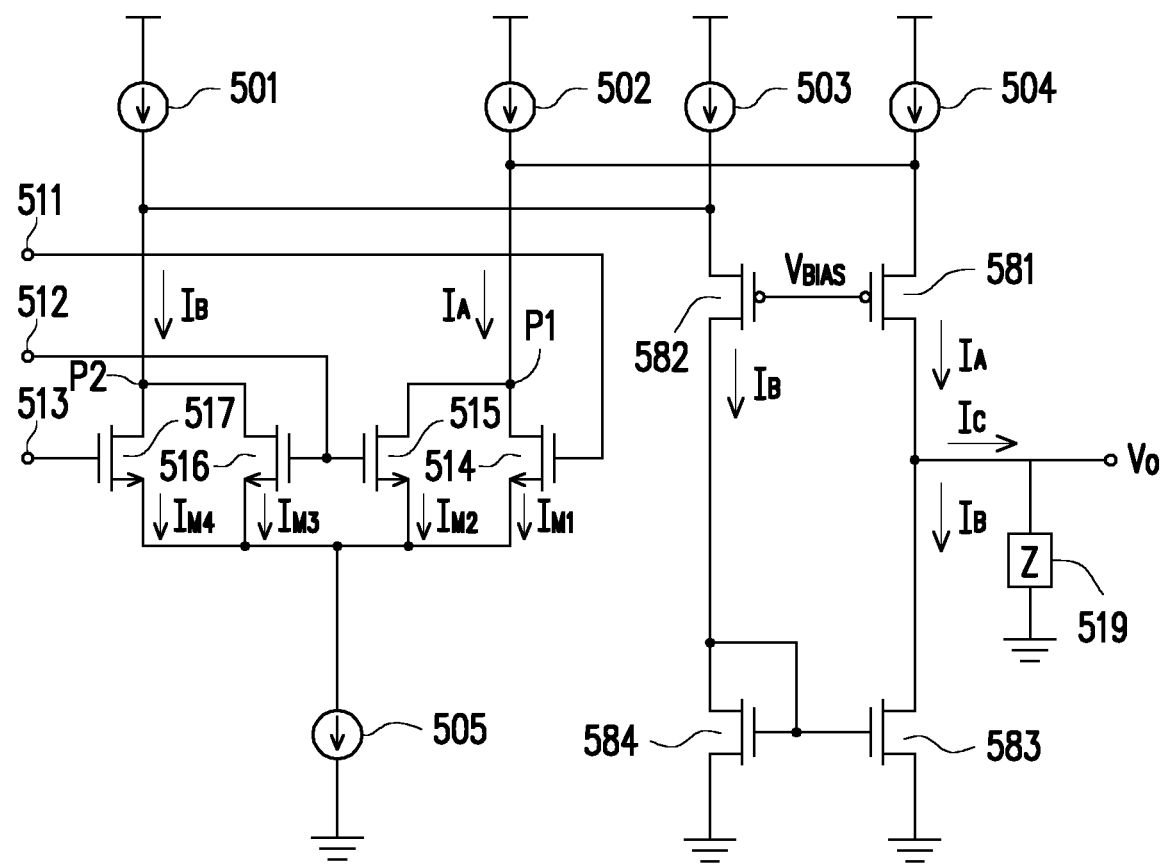
FIG. 5 is a circuit schematic diagram of an amplifier according to the first embodiment of the invention.

FIG. 5 is a circuit schematic diagram of an amplifier according to the first embodiment of the invention. Referring to FIG. 5, an amplifier 510 of FIG. 5 has the circuit framework of the amplifier of the embodiment of FIG. 2. In the embodiment, the amplifier 510 includes transistors 514-517 (corresponding to the voltage-current conversion elements 414-417 of FIG. 4), and the transistors 514-517 are N-type transistors. A first terminal of the transistor 514 and a first terminal of the transistor 515 are coupled to the current node P1. The current node P1 is coupled to a reference current source 502. A control terminal of the transistor 514 is coupled to the first input terminal 511 (the non-inverting input terminal) of the amplifier 510. A control terminal of the transistor 515 is coupled to the second input terminal 512 (the common mode input terminal) of the amplifier 510. A first terminal of the transistor 516 and a first terminal of the transistor 517 are coupled to the current node P2. The current node P2 is coupled to a reference current source 501. A control terminal of the transistor 516 is coupled to the second input terminal 512 of the amplifier 510. A control terminal of the transistor 517 is coupled to the third input terminal 513 (the inverting input terminal) of the amplifier 510. The respective second terminals of the transistors 514-517 are coupled to an equipotential node, and are coupled to a common reference current source 505.

In the embodiment, the amplifier 510 further includes transistors 581-584 (corresponding to the subtraction circuit 418 of FIG. 4) and a load unit 519 (corresponding to the current-voltage conversion element 419 of FIG. 4). The transistors 581 and 582 are P-type transistors, and the transistors 583 and 584 are N-type transistors. A first terminal of the transistor 581 is coupled to the current node P1 and a reference current source 504, and a control terminal of the transistor 581 is coupled to a reference voltage $V_{BIAS}$. A second terminal of the transistor 581 is coupled to the load unit 519 and a first terminal of the transistor 583. A first terminal of the transistor 582 is coupled to the current node P2 and a reference current source 503, and a control terminal of the transistor 582 is coupled to the reference voltage $V_{BIAS}$. In the embodiment, the second terminal of the transistor 581 may correspondingly output the reference current $I_A$ to the load unit 519, and the second terminal of the transistor 582 may correspondingly output the reference current $I_B$ to the first terminal of the transistor 584. The transistor 583 and the transistor 583 form a current mirror circuit. The transistor 583 may provide the corresponding reference current $I_B$ to the load unit 519. Therefore, the load unit 519 may obtain the reference current $I_C$ through a subtraction operation of the reference current $I_A$ and the reference current $I_B$. However, it should be noted that a current direction in FIG. 5 does not represent an actual current direction, and is only used to indicate a location where the current flows.

In the embodiment, the load unit 519 may, for example, include a circuit such as a resistor or a capacitor, which is not limited by the embodiment. The load unit 519 may convert the reference current $I_C$ into the output voltage $V_O$. It should be noted that since the first input terminal 511, the second input terminal 512, and the third input terminal 513 of the amplifier 510 of the embodiment are unnecessary to be attached with additional resistors, and the respective second terminals of the transistors 514-517 are coupled to an equal potential, transconductances of the transistors 514-517 of the embodiment are not limited by resistors, and the transistors may be arranged in a same well region during the manufacturing process and fabricated under the same manufacturing process, so that the three input terminal elements are all in the same well region to achieve a good matching effect.

Figure 6:
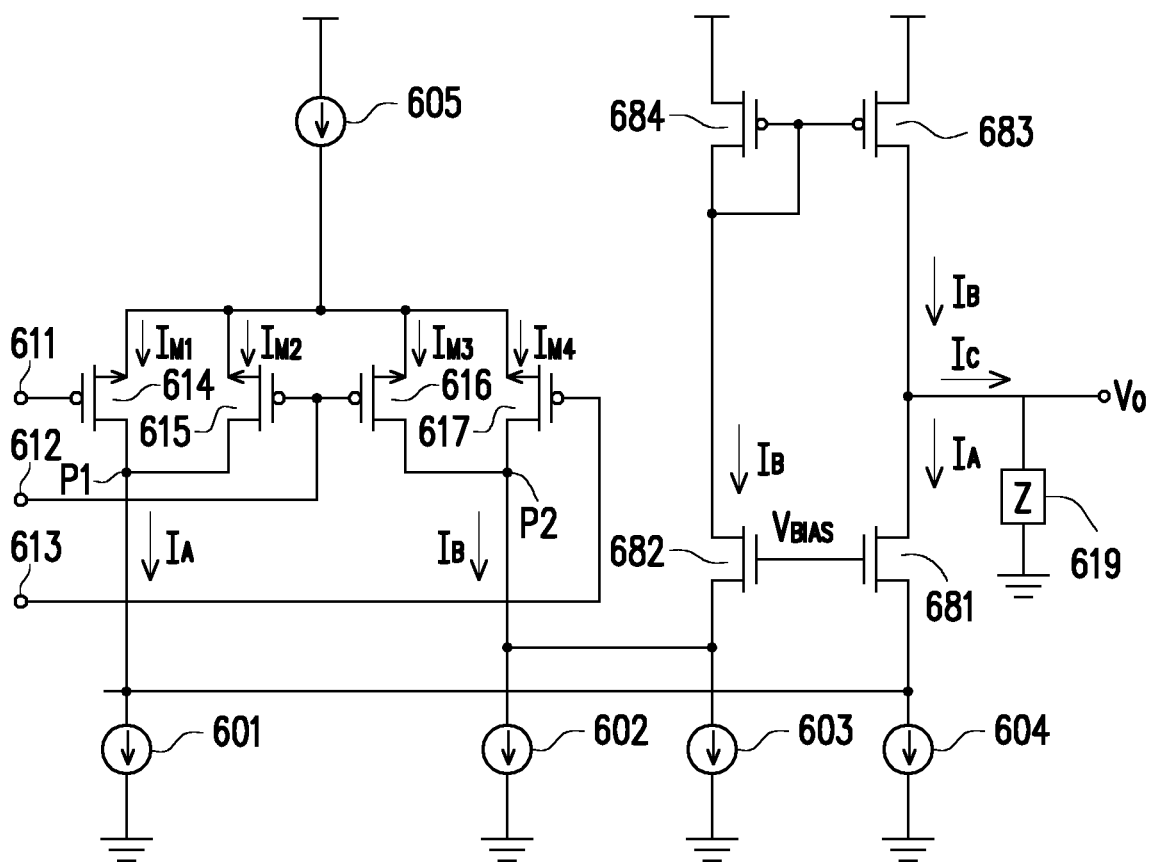
FIG. 6 is a circuit schematic diagram of an amplifier according to the second embodiment of the invention.

FIG. 6 is a circuit schematic diagram of an amplifier according to the second embodiment of the invention. Referring to FIG. 6, a circuit framework of an amplifier 610 of FIG. 6 is another implementation of the embodiment of FIG. 4 and is suitable for the amplifier 310 in the embodiment of FIG. 3. In the embodiment, the amplifier 610 includes transistors 614-617 (corresponding to the voltage-current conversion elements 414-417 of FIG. 4), and the transistors 614-617 are P-type transistors. A second terminal of the transistor 614 and a second terminal of the transistor 615 are coupled to the current node P1. The current node P1 is coupled to a reference current source 601. A control terminal of the transistor 614 is coupled to the first input terminal 611 (the inverting input terminal) of the amplifier 610. A control terminal of the transistor 615 is coupled to the second input terminal 612 (the common mode input terminal) of the amplifier 610. A first terminal of the transistor 616 and a first terminal of the transistor 617 are coupled to the current node P2. The current node P2 is coupled to a reference current source 602. A control terminal of the transistor 616 is coupled to the second input terminal 612 of the amplifier 610. A control terminal of the transistor 617 is coupled to the third input terminal 613 (the non-inverting input terminal) of the amplifier 610. The respective first terminals of the transistors 614-617 are coupled to an equipotential node, and are coupled to a common reference current source 605.

In the embodiment, the amplifier 610 further includes transistors 681-684 (corresponding to the subtraction circuit 418 of FIG. 4) and a load unit 619 (corresponding to the current-voltage conversion element 419 of FIG. 4). The transistors 681 and 682 are N-type transistors, and the transistors 683 and 684 are P-type transistors. A first terminal of the transistor 681 is coupled to the current node P1 and a reference current source 604, and a control terminal of the transistor 681 is coupled to the reference voltage $V_{BIAS}$. The first terminal of the transistor 681 is coupled to the load unit 619 and a second terminal of the transistor 683. A first terminal of the transistor 682 is coupled to the current node P2 and the reference current source 603, and a control terminal of the transistor 682 is coupled to the reference voltage $V_{BIAS}$. In the embodiment, a second terminal of the transistor 681 may correspondingly generate the reference current $I_A$ to the load unit 619, and a second terminal of the transistor 682 may correspondingly generate the reference current $I_B$ to a first terminal of the transistor 684. The transistor 683 and the transistor 683 form a current mirror circuit. The transistor 683 may provide the corresponding reference current $I_B$ to the load unit 619. Therefore, the load unit 619 may obtain the reference current $I_C$ through a subtraction operation of the reference current $I_A$ and the reference current $I_B$. However, it should be noted that the current direction in FIG. 6 does not represent an actual current direction, and is only used to indicate a location where the current flows.

In the embodiment, the load unit 619 may, for example, include a circuit such as a resistor or a capacitor, which is not limited by the embodiment. The load unit 619 may convert the reference current $I_C$ into the output voltage $V_O$. It should be noted that since the first input terminal 611, the second input terminal 612, and the third input terminal 613 of the amplifier 610 of the embodiment are unnecessary to be attached with additional resistors, and the respective first terminals of the transistors 614-617 are coupled to an equal potential, transconductances of the transistors 614-617 of the embodiment are not limited by resistors, and the transistors may be arranged in a same well region during the manufacturing process and fabricated under the same manufacturing process, so that the three input terminal elements are all in the same well region to achieve a good matching effect.

In summary, the current sensing circuit of the invention is suitable for high-side current sensing and low-side current sensing, and there is no need to couple additional resistors at the input terminals of the amplifier, so as to effectively reduce or eliminate the influence of the RC effect. In addition, the internal transistors of the amplifier of the current sensing circuit of the invention may have good transconductance matching to provide an effective current sensing function.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A current sensing circuit, comprising:
   an amplifier, having a first input terminal, a second input terminal, a third input terminal, and an output terminal;
   an input resistor, coupled between the first input terminal and the second input terminal;
   a sensing resistor, coupled between the second input terminal and the third input terminal; and
   a feedback circuit, coupled between the first input terminal and the output terminal,
   wherein when an input current flows through the sensing resistor, a voltage across the sensing resistor is equal to a voltage across the input resistor, and the feedback circuit correspondingly outputs a sensing voltage according to the input current.

2. The current sensing circuit as claimed in claim 1, wherein the second input terminal is coupled to an input voltage.

3. The current sensing circuit as claimed in claim 1, wherein the feedback circuit comprises:
   a feedback transistor, having a first terminal coupled to the first input terminal of the amplifier, a control terminal coupled to the output terminal of the amplifier, and a second terminal outputting the sensing voltage; and
   a feedback resistor, coupled between the second terminal of the feedback transistor and ground.

4. The current sensing circuit as claimed in claim 3, wherein the sensing voltage satisfies a following equation:

$$\frac{V_{OUT1}}{I_{S1}} = R_{S1} \times \frac{R_2}{R_1}$$

where $V_{OUT1}$ is a voltage value of the sensing voltage, $I_{S1}$ is a current value of the input current, $R_{S1}$ is a resistance value of the sensing resistor, $R_1$ is a resistance value of the input resistor, and $R_2$ is a resistance value of the feedback resistor.

5. The current sensing circuit as claimed in claim 1, wherein the second input terminal is coupled to a ground voltage, and the third input terminal is coupled to an input voltage.

6. The current sensing circuit as claimed in claim 1, wherein the feedback circuit comprises:
   a feedback transistor, having a first terminal coupled to a reference voltage, a control terminal coupled to the output terminal of the amplifier, and a second terminal outputting the sensing voltage; and
   a feedback resistor, coupled between the second terminal of the feedback transistor and the first input terminal of the amplifier.

7. The current sensing circuit as claimed in claim 6, wherein the sensing voltage satisfies a following equation:

$$\frac{V_{OUT2}}{I_{S2}} = R_{S2} \times \frac{R_3 + R_4}{R_3}$$

where $V_{OUT2}$ is a voltage value of the sensing voltage, $I_{S2}$ is a current value of the input current, $R_{S2}$ is a resistance value of the sensing resistor, $R_3$ is a resistance value of the input resistor, and $R_4$ is a resistance value of the feedback resistor.

8. The current sensing circuit as claimed in claim 1, wherein the amplifier comprises:
   a first voltage-current conversion element, coupled to the first input terminal of the amplifier and configured to output a first current to a first current node;
   a second voltage-current conversion element, coupled to the second input terminal of the amplifier and configured to output a second current to the first current node;
   a third voltage-current conversion element, coupled to the second input terminal of the amplifier and configured to output a third current to a second current node;
   a fourth voltage-current conversion element, coupled to the third input terminal of the amplifier and configured to output a fourth current to the second current node;
   a subtraction circuit, coupled to the first current node and the second current node, and configured to receive a first reference current output by the first current node and receive a second reference current output by the second current node, wherein the subtraction circuit subtracts the first reference current and the second reference current to output a third reference current; and
   a current-voltage conversion element, coupled to the subtraction circuit and configured to provide an output voltage to the feedback circuit according to the third reference current.

* * * * *